United States Patent [19]

Davis, Jr.

[11] Patent Number: 4,644,543
[45] Date of Patent: Feb. 17, 1987

[54] FORWARD ERROR CORRECTION HARDWARE FOR A DATA ADAPTOR

[75] Inventor: David C. Davis, Jr., Clearwater, Fla.

[73] Assignee: Honeywell Inc., Minneapolis, Minn.

[21] Appl. No.: 654,825

[22] Filed: Sep. 26, 1984

[51] Int. Cl.⁴ ............................................. G06F 11/10
[52] U.S. Cl. ....................................... 371/37; 364/200
[58] Field of Search ..................... 371/37, 38, 39, 40; 364/200, 900

[56] References Cited

U.S. PATENT DOCUMENTS

| | | | |
|---|---|---|---|
| 4,397,022 | 8/1983 | Weng | 371/37 |
| 4,468,769 | 8/1984 | Koga | 371/37 |
| 4,509,172 | 4/1985 | Chen | 371/38 |
| 4,564,944 | 1/1986 | Arnold | 364/200 |

Primary Examiner—Michael R. Fleming
Attorney, Agent, or Firm—Nicholas Prasinos; John S. Solakian

[57] ABSTRACT

An apparatus and a method is disclosed for correcting on-line error corrections in the digital transmission of voice or data utilizing forward error correction technique which avoids on-line calculations of the Massey or Berlekamp algorithms and the Chien search that it entails, and permits a simple hardware apparatus comprised of a ROM, shift registers, and exclusive OR gates, thus eliminating the requirement of a dedicated massive computer.

11 Claims, 1 Drawing Figure

FORWARD ERROR CORRECTION HARDWARE FOR A DATA ADAPTOR

BACKGROUND

1. Field of the Invention

This invention relates generally to forward error correction techniques and computer hardware, and more particularly to a unique forward error correction hardware and method which permits on-line error corrections in the transmission of voice or data and assures virtually error-free transmission.

2. Description of the Prior Art

In the transmission of digitally encoded information of either voice or data, a basic problem is the accuracy of such transmission because of loss of information due to noise or otherwise. Accordingly several techniques have been utilized to identify and correct transmission errors. One such technique is the forward error correction technique which utilizes classic codes, called linear block codes. The linear block codes are chosen so that the elements of the code are the members of a Galois field. The encoding process combines these block codes in a linear way and the decoding process takes them apart in a linear way also. The process of taking them apart is called ∓syndrome calculation". Since the code was built up linearly, it can be decomposed linearly. Generally a linear feedback shift register is the most cost effective means of doing this. The result of calculating the syndrome is a word having the same length as the word transmitted, which normally contains all 000s in the event that no errors exist. In the event errors exist, the syndrome is non-Zero. Obviously, then the information is in error, but which bits or bits of that information is in error is not yet obvious. In order to recover the error information from a syndrome calculation for a linear code, a Berlekamp algorithm or a Massey algorithm is utilized. The process for doing this is extremely lengthy and cannot be utilized on-line at reasonable data rates, but instead the data is gathered and then batch processed. For example, in a 1200 baud, 600 baud or 300 baud communication line, an extremely high-powered fast computing facility would be necessary. The cost of such a facility would be prohibitive for practical commercial applications. Once the Berlekamp algorithm is complete, however, a relatively simple Chien search is used to establish what the bit pattern actually is, and then the bit patterns are corrected by exclusive-ORing the error positions with the code positions thus inverting the bits that are in error. The Chien search and the actual correction procedure are relatively simple—roughly the same order of magnitude as the syndrome calculation.

What was needed therefore, is to speed up the algorithm calculations so that on-line operation is possible and provide a simple hardware solution which is low in cost and could be utilized in on-line transmission of information.

OBJECTS OF THE INVENTION

A primary object of the invention therefore is to provide an improved apparatus and method for the error-free transmission of information.

Another object of the invention is to provide an improved on-line forward error-correction apparatus.

Still another object of the invention is to provide low-cost, improved hardware that can be utilized on-line to detect and correct errors in electronically transmitting digital information.

These and other objects of the invention will become apparent from a description of a preferred embodiment of the invention when read in conjunction with the drawings contained herewith.

SUMMARY OF THE INVENTION

The basic concept of the invention is to avoid any on-line calculations of the Massey or Berlekamp algorithm and the Chien search that it entails. The concept proposed, therefore, is to precalculate all possible errors for a preselected code (e.g. Golay 24/12 code) and store those errors in predetermined patterns in read-only memory and provide additional hardware where the syndrome calculation produces an address utilized to look up the particular error pattern for that syndrome. The error pattern is then exclusively-ORed with the receive vector so that any bits in the error pattern that are non-Zero cause the bit in the block to be inverted, thus resulting in the corrected code.

The hardware includes a shift register implementation of a Galois field which is coupled to a read-only memory. As indicated above, the read-only memory stores all possible errors for the code selected. The syndrome calculation is then utilized as an address for read-only memory that looks up the particular error pattern for that syndrome. An exclusive-OR gate is coupled to the read-only memory to exclusive-OR any bits in the error pattern that are non-Zero, thus resulting in the corrected code.

BRIEF DESCRIPTION OF THE DRAWING

The novel features which are characteristic of the invention are set forth with particularity in the appended claims. The invention itself, however, both as to organization and operation, together with further objects and advantages thereof may be best understood by reference to the following description, taken in conjunction with the drawings in which:

GENERAL DISCUSSION AND THEORY

Introduction

Figure 1:
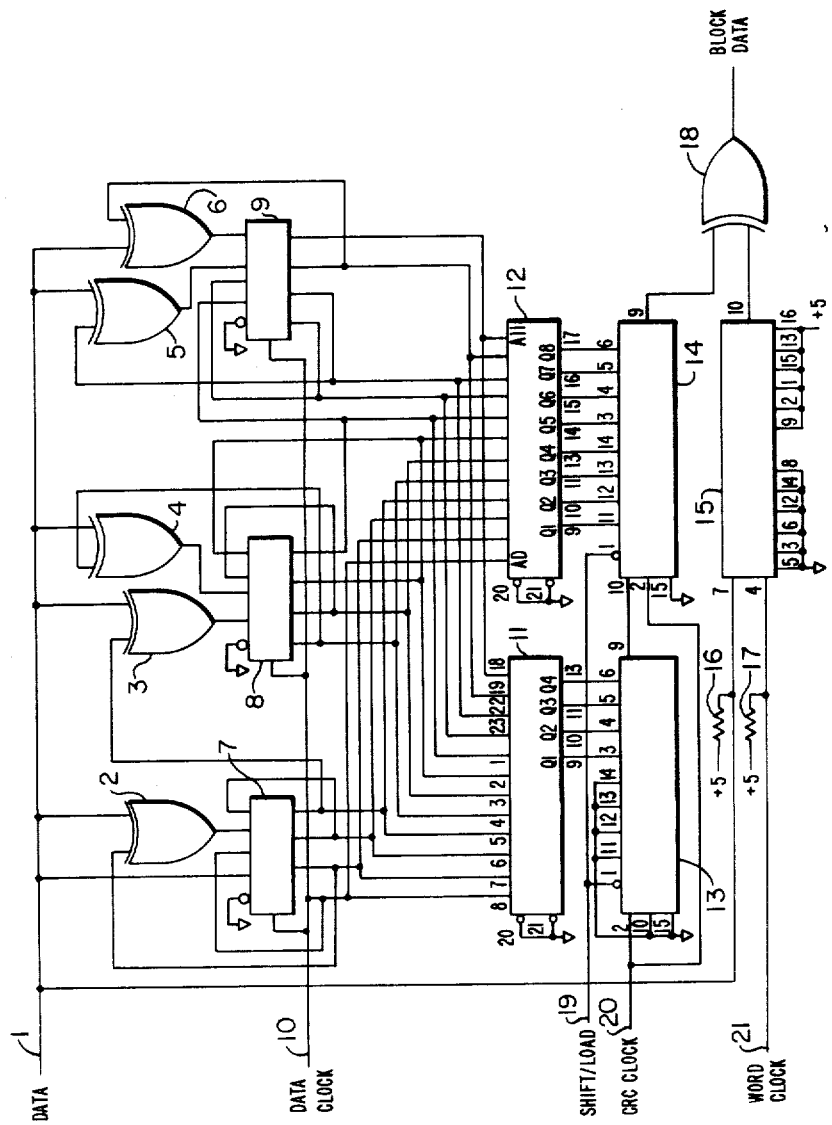
FIG. 1 is a detailed drawing of the invention.

The forward error correction (FED) is based upon the error-control techniques and message-to-loop-rate techniques. In general, the FEC methods include:

Redundant sampling and filtering.
Bit stuffing.
Use of the ½ rate Golay code with either single, double, or quadruple code word transmission (or any other BCH code). The ½ rate Golay code is a convenient vehicle for describing the technique.

To present the analysis and implementation of the ½ rate Golay code without frequent interruptions it is convenient at this point to describe concepts and definitions from coding theory.

Coding Theory Concepts and Definitions

The Golay code is a (23,12) perfect binary block code with a Hamming distance of seven between each of the members of the code alphabet.

The above sentence conveys most of the properties of the Golay code; however, it is convenient to examine the definition of several terms. These are perfect code, binary code, linear code, block code, Hamming distance, code alphabet and (23,12).

Binary Code

A binary code is simply a code in which each digit transmitted can have only two values usually represented as a 0 and a 1 and called a bit instead of a digit. Golay has proposed that these be referred to as binits.

Linear Code

The definition of a linear code requires the introduction of a substantial number of new terms. A linear code is a set of vectors of length n that is a subset of a set of all n-tuples with entries chosen from the field of two elements.

Hamming Distance

The Hamming distance between the two vectors, or n-tuples, is the number of positions in which they differ. For example, 7-bit ASCII code for the symbol A is 1000001 and for the symbol B is 0100001. Thus the Hamming distance between the ASCII code representation of these symbols is two since they differ in the two positions and are the same in 5 positions.

(23,12)

It is customary to describe linear block codes as (n,k,d) codes where n is the number of bits in the encoded word (23 in our case) and k is the number of information bits (12 in our case).

Code Alphabet

Note that there are only 12 information bits provided and therefore only $2^{12}=4096$ possible different values that can be presented by the 12 information bits. The encoder maps each of these 4096 values into a unique 23-bit value. These 4096 23-bit words comprise the code alphabet. In the process of the above definitions, two new terms have appeared, "field of two elements" and "vector space of n-tuples".

Field of Two Elements

In general, a field is a set of elements with two defined operations, called addition and multiplication, that meet the following criteria.

Under addition:
The set is closed. That is, the addition of any two elements of the set gives another element of the set.
Addition is associative. That is, given three set elements a, b, c $(a+b)+c=a+(b+c)$.
There is an identity element in the set. Usually 0 is used for the additive identity element. This simply means that for any element a of the set, $0+a=a$.
Every member of the set has an inverse element that is also a member of the set. This simply means that for every member of the set, a member b exists such that $a+b=0$.
Addition is commutative. That is, for any two set members a and b, $a+b=b+a$.
Under multiplication:
The set is closed.
Multiplication is associative $(ab)c=a(bc)$.
A multiplicative identity element is a member of the set such that $(1 \cdot a=a)$.
A multiplicative inverse b is a member of the set such that $a \cdot b=1$ for every member a in the set.
Multiplication is commutative, $ab=ba$, and multiplication and addition obey the distributive law: $a(b+c)=a(b+c)=ab+ac$ for all members a, b, c of the set.

The two members of the set of two elements could thus be named (0,1) since a multiplication and addition inverse is needed. The two operations are defined as follows:

Addition $$0+0=0$$
$$1+0=1$$
$$0+1=1$$
$$1+1=0$$

Multiplication $$0 \cdot 0=0$$
$$1 \cdot 0=0$$
$$0 \cdot 1=0$$
$$1 \cdot 1=1$$

It is important to note that the addition defined above is equivalent to the "exclusive-OR" logic operation and multiplication defined above is equivalent to the logic operation "AND". The fact that these elements and operations form a field can be verified by checking that they meet the requirements previously given.

Vector Space of n-tuples

The n-tuple that we refer to are n-place numbers, with only the binary values 0 and 1 permitted at each place. We are going to regard these as n-bit vectors. We define vector addition as the addition defined for the field of two elements for each position of the vector. Thus under the above defined operations, the addition of 1001001 and 1100011 wqould be 0101010.

The other axioms of a vector space are:
1. For any vector $\bar{v}$ in the vector space $\bar{V}$ and any field element c, the product of $c\bar{v}$ is a vector in $\bar{V}$. Note that our field is the field of two elements, therefore $c=(0,1)$.
2. If the $\bar{u}$ and $\bar{v}$ are vectors in $\bar{V}$ and c is any field element, then $c(u+v)=c\bar{u}+c\bar{v}$.
3. If $\bar{v}$ is a vector in $\bar{V}$ and c and d are any field elements, then $(c+d)v=cv+d\bar{v}$.
4. If $\bar{v}$ is a vector in $\bar{V}$ and c and d are any field elements, the $(cd)\bar{v}32\ c(d\bar{v})$.

Thus we define addition of two n-tuples $(a_1, a_2 \ldots a_n)$ and $b_1, b_2 \ldots b_n)$ as $(a_1+b_1, a_1+b_1, a_2+b_2, \ldots a_n+b_n)$ where $a_i$ and $b_i$ are 0 and 1 and $+$ is the exclusive-OR operation.

We define multiplication of two n-tuples as $(a_1,a_2, \ldots a_n)(b_1,b_2 \ldots b_n)=(a_1 \cdot b_1, a_2 \cdot b_2 \ldots a_n \cdot b_n)$ where $a_i$ and $b_i$ are the elements 0 and 1 and $\cdot$ is the AND operation.

Scaler multiplication $c(a_1,a_2 \ldots a_n)$ is defined as $(c \cdot a_1, c \cdot a_2, \ldots c \cdot a_n)$.

Before we progress further, some conventions should be noted. First, an n-tuple, e.g., (1,0, 0, 0, 0, 1, 1, 1) is usually written as a polynomial $X^7+X^2+X+1$. The exponent simply gives the position within the n-tuple with the rightmost element represented as $a_iX^o$. If $a_i=1$, it is written as $1 \cdot X^o=1$. If $a_i=0$, $0 \cdot X^o=0$ and following convention, the term is simply omitted. The next term to the left is $a_i \cdot X^1$, and so forth. Note that a left shift with a 0 fill on the right is equivalent to a multiplication by X, i.e., $X(X^7+X^2+X+1)=X^8+X^3+X^2+X=(1, 0, 0,$ 0, 0, 1, 1, 1, 0). Thus vector multiplication can be defined. For example:

$$(X^3+1)(X+1)=X^4+X^3+X+1.$$

To gain some insight into why linear codes are useful for error correction and detection, assume that we wanted to transmit an integer to a remote location and have some redundancy in the transmission so that we could recognize an erroneous value when received. If we first multiplied this integer to be transmitted by a "prime" integer, transmitted this product and then, at the receiver, divided by the same prime integer, we would expect a remainder of 0. If the remainder were not 0, we would know that an error had occurred in the transmission. More formal is a statement of the Euclidian division algorithm. For every pair of integers, S and M, there exists a unique pair of integers q and r such that $S=mq+r$. If m is prime, the residue class r is a field (more correctly, the ring formed by the residue class modulo m is a field). A field of this type is called a Galois field.

Now we will make an analogy between integers and polynomials. Let S(X), g(x), q(X) and r(X) be polynomials with coefficients from the field of two elements and $$S(X)=g(X)q(X)+r(X)$$

where
- S(X) is the polynomial transmitted
- g(X) is an analogous with the prime integer m
- q(X) is the result (quotient) of dividing S(X) by g(X)
- r(X) is the remainder (residue)

The polynomial (vector, n-tuple) to be transmitted is thus formed by multiplying the information polynomial q(X) by the encoding polynomial generator) g(X) and the information is recovered at the receiver by dividing S(X) by g(X). If no errors occurred in transmission, r(X) will be $=0$. If errors occurred, r(X) will not equal 0, except where the number of errors was larger than the error detecting capability of $g(X) \cdot q(X)$.

In general, the n-tuple represented by q(X) may take on any value. In our case, q(X) is a 12-tuple and 4096 values exist. $g(X) \cdot q(x)$ is a 23-tuple but only 4096 values exist. An error in transmission goes unnoticed only if the errors in the 23-tuple map one of the 4096 values into another of these 4096 values. A measure of how well g(X) encodes is the Hamming distance between the two closest members of the n-tuple (23-tuple in our case). In the case of the Golay code, the Hamming distance is seven. Thus six or fewer errors would always be recognized. The Hamming distance between the two closest members $q(X) \cdot g(X)$ is the minimum distance of the code and is usually indicated by the letter d. It is possible to detect all patterns of d-1 or fewer errors, and it is possible to correct t errors if $2t+1=d$. Thus the (23,12)Golay code permits the correction of 3 or fewer errors.

The selection of g(X) is critical to the d of the code. Since g(X) has already been chosen as $X^{11}+X^{10}+X^6+X^5+X^4+X^2+1$, a discussion of how to choose g(X) seems inappropriate. It is sufficient to point out that the g(X) must divide $X^N+1$ where n is the block length with a 0 residue. A little trial and error here gives the factorization:

$$X^{23}+1=g(X)h(X)=(X^{11}+X^{10}+X^6+X^5+X^4+X^2+1)(X^{11}+X^9+X^7+X^6+X^5+X+1)(X+1).$$

It is well known that linear feedback shift registers can be used to multiply the generator polynomial times the information vector and that a similar linear feedback shift register can be used to divide the received signal S(X) to reconstruct the information vector and the residue polynomial. It is less well known that an equivalent procedure based upon a matrix description exists. It is this matrix description that we will use to simplify the hardware for error correction; therefore, will concentrate upon the equivalent matrix description.

We could build up the equivalent matrix description in an axiomatic way; however, we have chosen to present a generator and a null space matrix for the Golay code and then describe its properties and why it works by referring to this specific example. The generator matrix is represented as a G, the null space matrix is represented as an H. The information vectors are represented as $\bar{v}$. $\bar{v}$ times G gives the encoded vector to be transmitted, which we call $\bar{u}$. $\bar{u} \times H^T$ gives the residue or syndrome. $H^T$ is the transpose of H, i.e., H with rows and columns interchanged.

A few words about G, H and the products of $\bar{v}G$ $\bar{u}H^T$ and $G \cdot H^T$ are probably in order. We have chosen to discuss each of these as part of the example.

The Golay code makes use of the factorization of $X^{23}+1=g(X)h(X)=(X^{11}+X^{10}+X^6+X^5+X^4+X^2+1)(X^{11}+X^9+X^7+X^6+X^5+X+1)(X+1)$. The generator matrix G is thus.

$$G = \begin{array}{l}
11000111010100000000000 = X^{11} \cdot g(X) \\
01100011101010000000000 = X^{10} \cdot g(X) \\
00110001110101000000000 = X^9 \cdot g(X) \\
00011000111010100000000 = X^8 \cdot g(X) \\
00001100011101010000000 = X^7 \cdot g(X) \\
00000110001110101000000 = X^6 \cdot g(X) \\
00000011000111010100000 = X^5 \cdot g(X) \\
00000001100011101010000 = X^4 \cdot g(X) \\
00000000110001110101000 = X^3 \cdot g(X) \\
00000000011000111010100 = X^2 \cdot g(X) \\
00000000001100011101010 = X \cdot g(X) \\
00000000000110001110101 = 1 \cdot g(X)
\end{array}$$

and $$h(X) = (X^{11} + X^9 + X^7 + X^6 + X^5 + X + 1)(X + 1)$$
$$= X^{12} + X^{11} + X^{10} + X^9 + X^8 + X^5 + X^2 + 1$$

$$H = \begin{array}{l}
00000000001010010011111 = h(X) \\
00000000010100100111110 = Xh(X) \\
00000000101001001111100 = X^2h(X) \\
00000001010010011111000 = X^3h(X) \\
00000010100100111110000 = X^4h(X) \\
00000101001001111100000 = X^5h(X) \\
00001010010011111000000 = X^6h(X) \\
00010100100111110000000 = X^7h(X) \\
00101001001111100000000 = X^8h(X) \\
01010010011111000000000 = X^9h(X) \\
10100100111110000000000 = X^{10}h(X)
\end{array}$$

$$G_{12 \times 23} H^T{}_{23 \times 11} = \begin{array}{l}
00000000000 \\
00000000000 \\
00000000000 \\
00000000000 \\
00000000000 \\
00000000000 \\
00000000000 \\
00000000000 \\
00000000000 \\
00000000000 \\
00000000000 \\
00000000000
\end{array} = 0_{12 \times 11}$$

We have not given the rules for matrix multiplication. Using the example, the first row of G (11000111010100000000000) is multiplied times the first column of $H^T$ (00000000001010010011111) to obtain the first 0 (the 0 in row 1 column 1 of $0_{12\times 11}$). The calculation is
1·1+1·0+0·0+0·0+0·0+1·0+1·0+1·0+0·0+1·0+0·1+1·0+0·1+0·0+0·0+0·1+0·0+0·0+0·1+0·1+0·1+0·1+0·1+0·1=0. The first entry in each term is from G and the second entry in each term is the corresponding term from $H^T$. Remember that + means exclusive-OR. The second row of $G \cdot H^T$ gives the 0 in row 1 column 2, etc. Thus matrix multiplication here is the same as the normal matrix multiplication for linear analysis except for + being the exclusive-OR operation.

It can be shown that the matrix G has rank 12 and that the rows of G form a set of basis vectors for a vector space of dimension 12. It can also be shown that the rank of H is 11 and that the rows of $H^T$ form a set of basis vectors for a vector space of dimension 11. The multiplication of $G \cdot H^T$ shows that these vector spaces are not coupled. Usually G is not given in the form shown above, but is converted to a matrix of the form (I,P)=G, where I, the identity matrix, has ones on the main diagonal and 0's at all other positions. This is called a standard array and is obtained from G by adding rows or interchanging rows and is thus still in the same vector space. The advantage of the standard array is the first 12 bits of the transmitted vector are unchanged, i.e., information bits. The matrix P is called a generalized parity check matrix.

Note that the H given still nulls, i.e., produces a $0^{12 \times 11}$ matrix for the new generator matrix G' since G' is a set of basis vectors for the same vector space spanned by G.

As an example of encoding and decoding, consider the word THE. The ASCII representation of THE is:

|     | b8 | b7 | b6 | b5 | b4 | b3 | b2 | b1 |
| --- | --- | --- | --- | --- | --- | --- | --- | --- |
| T = | 0 | 1 | 0 | 1 | 0 | 1 | 0 | 0 |
| H = | 1 | 1 | 0 | 0 | 0 | 1 | 0 | 1 |
| E = | 0 | 1 | 0 | 0 | 0 | 1 | 0 | 1 |

The word is divided into two 12 bit blocks as shown below.
$V_1$ = 100001010100
$V_2$ = 010001011100
$V_1 X G$ = 11000000100001111000100 = $u_1$
$V_2 X G$ = 01100100101110001101100 = $u_2$
$u_1 X H^T$ = 00000000000 = $S_1$
$u_2 X H^T$ = 00000000000 = $S_2$ Now if the channel introduces errors in the transmission, the results of the syndrome calculation ($S_1$ and $S_2$) will be non-Zero. For example, suppose b9 was in error, then
$u_1 X H^T$ = 01001111100 = $S_1$
$u_2 X H^T$ = 01001111100 = $S_2$ The reason for our interest is not in encoding (multiplication by g(X)) or decoding (dividing by g(X), also called syndrome calculation), but in error correction. After the syndrome calculation is completed, two additional steps are required.

The Berlekamp algorithm, or equivalent Massey algorithm, followed by Chien search. The Berlekamp algorithm is very much more complicated than the syndrome calculation and the Chien search is similar to the syndrome calculation in complexity. In the case of the Golay code, some other slightly simpler techniques are known, but they are still considered to be cumbersome.

Note from the error patterns produced by $u_1 X H^T = S_1$ and $u_2 X H^T = X_2$ that the syndrome is the same for all errors in b9. A similar observation can be made for single errors in any of the other 23 positions. Note also that we are only interested in correcting errors in the first 12 positions since that gives us the information transmitted. Therefore, for single errors, only 12 syndrome patterns of interest exist. For double errors a total of 198 syndrome patterns of interest exist. For triple errors, a total of 1606 patterns of interest exist. An additional 231 patterns exist that involve errors in bits 13 through 23 only. These patterns are unique. Thus error correction is accomplished by simply storing a 12 bit number in a 2048×12 ROM. This 12 bit number is a tabulation of the bits in error versus the syndrome. The syndrome is used as the address and the locations stores 1's at the bit positions in error. The 12 bit ROM output is "exclusive-ORed" with the received information vector thus yielding the corrected output.

The purpose of the above discussion was to show that it is possible to replace both the Berlekamp algorithm and the Chien search in FEC with a simple table lookup operation (two read-only-memory integrated circuits are the hardware requirements). This is an enormous simplication over the FEC methods currently employed in the prior art.

PREFERRED EMBODIMENT

Referring now to FIG. 1 there is shown a 12-bit shift register comprised of elements 7, 8 and 9. These elements are commercially available and are identified as LS195. Data is supplied to the data input terminal 1 in bit serial fashion. The bit serial data is shifted into the fault bit shift register 7, 8 and 9. The shift register is enabled so that the parallel pass in the register is used. The bits are fed forward by either the parallel connection on the shift register or via an exclusive-OR gate. There are 5 exclusive-OR gates 2, 3, 4, 5 and 6. After the receipt of 23 data clocks, the contents of the shift register 7, 8 and 9 will be Zero., i.e. all 12 bits will be Zero—in the event there were no errors in the transmission. In the event errors existed at least one of these 12 bits will be non-Zero. For error patterns of 1, 2, or 3 bits in the 23 bits received, the shift register contains a unique pattern for each possible combination of one, two or three errors. The output of the shift register is then applied to read-only memory 11 and 12. The read-only memory address is supplied by the shift register. In the event no bits are in error, the shift register contains all Zeros in the appropriate location; e.g., address zero. In the event the syndrome calculation is non-Zero, then the shift register will have an output different from Zero and this will be the address in read-only memory 11, 12 that will have contents that contain the exact error pattern that would cause the syndrome. The output of the read-only memory is thus the bits that are in error for the address syndrome calculated by the shift register. The read-only memory output is read by another 12-bit shift register 13, 14. The elements of this shift register are also commercially available and are identified as LS164. These bits are loaded into shift register 13, 14 by the shift/load signal applied to terminal 19 and are shifted by the CRC clock signal applied to terminal 20.

The sequence of operation up to this point would be as follows: 23 data bits are loaded into shift registers 7, 8, 9 via a data terminal 1 using data clock signal applied to data clock terminal 10. The shift register 7, 8, 9 being the hardware implementation for calculating the syndrome would provide the address of an error pattern at the conclusion of the 23-bit cycle to the read-only memory 11, 12. The read-only memory addressed by the calculated syndrome would then produce an output giving any bits in error. That output is provided to shift register 13, 14 under CRC clock 20.

Concurrently with the above process, the data bits received on data terminal 1 in the 23-bit tansmission are also stored in shift register 15 under the control of word clock signal applied on word clock 21. Shift register 15 is a commercially available element identified as MC14557B and is utilized as a decoder and is well known in the art.

In order to perform the error correction, the shift register 13, 14 receives a shift signal at terminal 19. The CRC clock is then applied simultaneously at terminal 20 with a word clock on terminal 21 so that the 12 bits in shift register 15 are shifted out simultaneously with the 12 bit error correcting pattern in shift register 13, 14. In the event that any bits are in error, the corresponding bit in the shift register 13, 14 would have the value (1), thus causing the output of exclusive-OR gate 18 to be inverted and correcting the bit in error. If no bits are in error, or if any particular bit is in error, Zero would appear in the appropriate bit position and the shift register 13, 14 causes the data coming from shift register 15 to be accepted in exactly the same form as block data output. This hardware corrects on-line any errors transmitted up to a total of three errors in a 23-bit transmission.

Having shown and described a preferred embodiment of the invention, those skilled in the art will realize that many variations and modifications may be made to effect the described invention and still be within the scope of the claimed invention. Thus, many of the elements indicated above, may be altered or replaced by different elements which will provide the same result and fall within the spirit of the claimed invention. It is the invention, therefore, to limit the invention only as indicated by the scope of the claims.

What is claimed is:

1. The error correction system for correcting on-line errors generated in transmitting digitally encoded information in a predetermined code comprising:
   a. first means for storing precalculated error patterns for a predetermined code (e.g. Golay 23/12) in a predetermined pattern;
   b. second means coupled to said first means for performing a complete factorization of $X^{23}+1$ according to the polynomial $g(x)=X^{11}+X^{10}+X^6+X^5+X^4+X^2+1$ on said encoded information, the result of which is utilized to address said first means;
   c. third means coupled to said first means for receiving precalculated error patterns addressed by said second means;
   d. fourth means for receiving the digitally encoded information in a predetermined code; and
   e. fifth means coupled to said third and fourth means for exclusive ORing the precalculated error patterns with the digitally encoded information.

2. The error correction system as recited in claim 1 wherein said first means is a read-only memory (ROM).

3. The error correction system as recited in claim 2 wherein said second means is a shift register.

4. The error correction system as recited in claim 3 wherein said third means is a shift register.

5. The error correction system as recited in claim 4 wherein said fourth means is also a shift register.

6. The error correction system as recited in claim 5 wherein said fifth means is an exclusive OR gate.

7. The error correction means as recited in claim 6 including a parallel connection on said second means for shifting forward the bits in said second means.

8. The error correction system as recited in claim 1 including sixth means coupled to said second means for shifting forward the bits stored in said second means.

9. The error correction means as recited in claim 8 wherein said sixth means are exclusive OR gates.

10. The method of on-line error correction of either voice or data of digitally encoded information in linear block codes chosen so that the elements of the code are members of a Galois field, said information transmitted from a first communication system to a second communication system, said second communication system having at least a read-only memory (ROM) and exclusive OR means, said method comprising the steps of:
   a. precalculating all possible errors for a peselected code (e.g. Golay 23/12);
   b. prestoring those errors in predetermined patterns in the read-only memory (ROM) of said second communication system;
   c. making an on-line syndrome calculation of a complete factorization of $X^{23}+1$ according to the polynomial $g(x)=X^{11}+X^{10}+X^6+X^5+X^4+X^2+1$;
   d. utilizing the result of the syndrome calculation to address said ROM;
   e. obtaining the error bit pattern stored in the addressed location of said ROM; and,
   f. exclusive ORing the error bit pattern with the information received by said second communication system.

11. The method of on-line error correction of digital data transmitted from one computer system to another computer system over a communication line, said computer systems provided with a read-only memory (ROM), said method comprising the steps of:
   a. precalculating all possible errors for a preselected code (e.g. Golay 23/12 code);
   b. prestoring those errors in predetermined patterns in a read-only memory (ROM) of a receiving computer system;
   c. making an on-line syndrome calculation of a complete factorization of $X^{23}+1$ according to the polynomial $g(x)+X^{11}+X^{10}+X^6+X^5+X^4+X^2+1$;
   d. utilizing the result of the syndrome calculation to address the read-only memory of the receiving computer system;
   e. obtaining the error bit patterns from the addressed location in said read-only memory (ROM) of said receiving computer system; and
   f. exclusive ORing the error bit patterns obtained from said ROM with the data received from one of said computer systems.

* * * * *